US008003882B2

(12) United States Patent
Pisklak et al.

(10) Patent No.: US 8,003,882 B2
(45) Date of Patent: Aug. 23, 2011

(54) METHODS AND SYSTEMS FOR ASPHALT ROOF INTEGRATED PHOTOVOLTAIC MODULES

(75) Inventors: Stephen George Pisklak, Hockessin, DE (US); James Allan Rand, Landenberg, PA (US); Ralf Jonczyk, Wilmington, DE (US); Alysha Grenko, Bulger, PA (US)

(73) Assignee: General Electric Company, Schenectady, NY (US)

( * ) Notice: Subject to any disclaimer, the term of this patent is extended or adjusted under 35 U.S.C. 154(b) by 715 days.

(21) Appl. No.: 11/557,231

(22) Filed: Nov. 7, 2006

(65) Prior Publication Data

US 2008/0105291 A1    May 8, 2008

(51) Int. Cl.
*H01L 31/0203*    (2006.01)
*H01L 31/0224*    (2006.01)

(52) U.S. Cl. ........ 136/251; 136/244; 136/246; 136/256; 136/259; 438/64

(58) Field of Classification Search .................. 136/243, 136/244, 246, 251
See application file for complete search history.

(56) References Cited

U.S. PATENT DOCUMENTS

| | | | |
|---|---|---|---|
| 3,769,091 A | 10/1973 | Leinkram et al. | |
| 4,040,867 A | 8/1977 | Forestieri et al. | |
| 4,189,881 A | 2/1980 | Hawley | |
| 4,321,416 A | 3/1982 | Tennant | |
| 4,674,244 A | 6/1987 | Francovitch | |
| 4,818,337 A * | 4/1989 | Barnett et al. | 136/256 |
| 4,860,509 A | 8/1989 | Laaly et al. | |
| 4,886,554 A | 12/1989 | Woodring et al. | |
| 5,112,408 A | 5/1992 | Melchior | |
| 5,316,592 A | 5/1994 | Dinwoodie | |
| 5,338,369 A | 8/1994 | Rawlings | |
| 5,437,735 A | 8/1995 | Younan et al. | |
| 5,575,861 A * | 11/1996 | Younan et al. | 136/251 |
| 5,656,098 A * | 8/1997 | Ishikawa et al. | 136/256 |

(Continued)

FOREIGN PATENT DOCUMENTS

EP    0074791 B1    8/1985

(Continued)

OTHER PUBLICATIONS

A Communication pursuant to Article 94(3) EPC from the European Patent Office dated Jan. 9, 2009 for the corresponding EP Patent Application No. 07120012.5-1528 (4 pages).

(Continued)

*Primary Examiner* — Jennifer K. Michener
*Assistant Examiner* — Jayne Mershon
(74) *Attorney, Agent, or Firm* — Armstrong Teasdale LLP (57) ABSTRACT

Methods and systems for photovoltaic roofing systems are provided. The system includes a back sheet including a length, L, a width, W, and a thickness, T, the back sheet including an overlap portion extending along length L having a width, WO and an active portion extending along length L having a width, WA. The system also includes a photovoltaic cell formed on a surface of the active portion, the photovoltaic cell including a photovoltaic member electrically responsive to an absorption of photons, a negative electrode coupled to a surface of the photovoltaic member, and a positive electrode coupled to the surface of the photovoltaic member, wherein the thickness T is selected such that thickness T plus a thickness of the photoelectric cell substantially match a thickness of a proximate non-photovoltaic roofing member when the photovoltaic roofing system is installed.

20 Claims, 7 Drawing Sheets

U.S. PATENT DOCUMENTS

| | | | |
|---|---|---|---|
| 5,830,779 A | 11/1998 | Bressler et al. | |
| 2002/0134422 A1 | 9/2002 | Bauman et al. | |
| 2004/0144043 A1* | 7/2004 | Stevenson et al. | 52/173.3 |
| 2005/0172996 A1* | 8/2005 | Hacke et al. | 136/256 |
| 2005/0178429 A1* | 8/2005 | McCaskill et al. | 136/251 |
| 2006/0042682 A1 | 3/2006 | Wolfe et al. | |
| 2007/0079868 A1* | 4/2007 | Rose et al. | 136/252 |
| 2007/0193618 A1 | 8/2007 | Bressler et al. | |
| 2007/0227583 A1* | 10/2007 | Davies et al. | 136/251 |

FOREIGN PATENT DOCUMENTS

| | | |
|---|---|---|
| JP | 2001227109 A | 8/2001 |
| WO | 2005100715 A1 | 10/2005 |

OTHER PUBLICATIONS

A Communication from the European Patent Office, including a European Search Report, dated Apr. 18, 2008 for the corresponding EP Patent Application No. 07120012.5-1528 (7 pages).

* cited by examiner

METHODS AND SYSTEMS FOR ASPHALT ROOF INTEGRATED PHOTOVOLTAIC MODULES

BACKGROUND OF THE INVENTION

This invention relates generally to integrated photovoltaic roofing systems, and more specifically to methods and systems for roofing shingles having photovoltaic modules integrated into the shingle.

At least some known roofing systems with asphalt roofs mount directly on top of the existing shingles. Other known roofing systems replace the roofing tiles with an area that looks like a black or blue area covering a portion of the roof. Such products are often advertised as being photovoltaic cells "integrated" into a shingle roof but the photovoltaic cells are simply surrounded by standard asphalt roofing tiles. However, such roofing systems lack flexibility in design or construction methods to allow the various colors and shapes that are necessary to match the various product lines available in the asphalt roofing market to provide the aesthetic appeal needed for a residential rooftop photovoltaic solar system.

BRIEF DESCRIPTION OF THE INVENTION

In one embodiment, a photovoltaic roofing system includes a back sheet including a length, L, a width, W, and a thickness, T, the back sheet including an overlap portion extending along length L having a width, $W_O$ and an active portion extending along length L having a width, $W_A$. The system also includes a photovoltaic cell formed on a surface of the active portion, the photovoltaic cell including a photovoltaic member electrically responsive to an absorption of photons, a negative electrode coupled to a surface of the photovoltaic member, and a positive electrode coupled to the surface of the photovoltaic member, wherein the thickness T is selected such that thickness T plus a thickness of the photoelectric cell substantially match a thickness of a proximate non-photovoltaic roofing member when the photovoltaic roofing system is installed.

In another embodiment, a method of assembling a photovoltaic roofing system includes providing a substrate of roofing material including a top surface, a bottom surface and an edge extending therebetween about an outer periphery of the substrate, the substrate includes an overlay portion configured to be covered by at least one of an adjacent photovoltaic roofing system and an adjacent roofing shingle, the substrate further includes an active portion, forming a photovoltaic cell on the top surface of the active portion, the photovoltaic cell including a photovoltaic member electrically responsive to an absorption of photons, a negative electrode coupled to a surface of the photovoltaic member, and a positive electrode coupled to the surface of the photovoltaic member, and electrically coupling the negative electrode and the positive electrode to an electrical plug extending from the edge.

In yet another embodiment, a photovoltaic roofing system includes a back sheet including a first thickness, the back sheet including an overlap portion, a header portion configured to permit the roofing assembly to be coupled to a roof surface, and an adjacent active portion extending from the overlap portion, the active portion including a plurality of tab portions, a photovoltaic cell formed on a surface of each the tab portions, the photovoltaic cell including a second thickness, the photovoltaic cell further including a photovoltaic member, a negative electrode coupled to a surface of the photovoltaic member, and a positive electrode coupled to the surface of the photovoltaic member, wherein the first thickness plus the second thickness is substantially equal to a thickness of a proximate non-photovoltaic roofing member when the photovoltaic roofing system is installed.

DETAILED DESCRIPTION OF THE INVENTION

Figure 1:
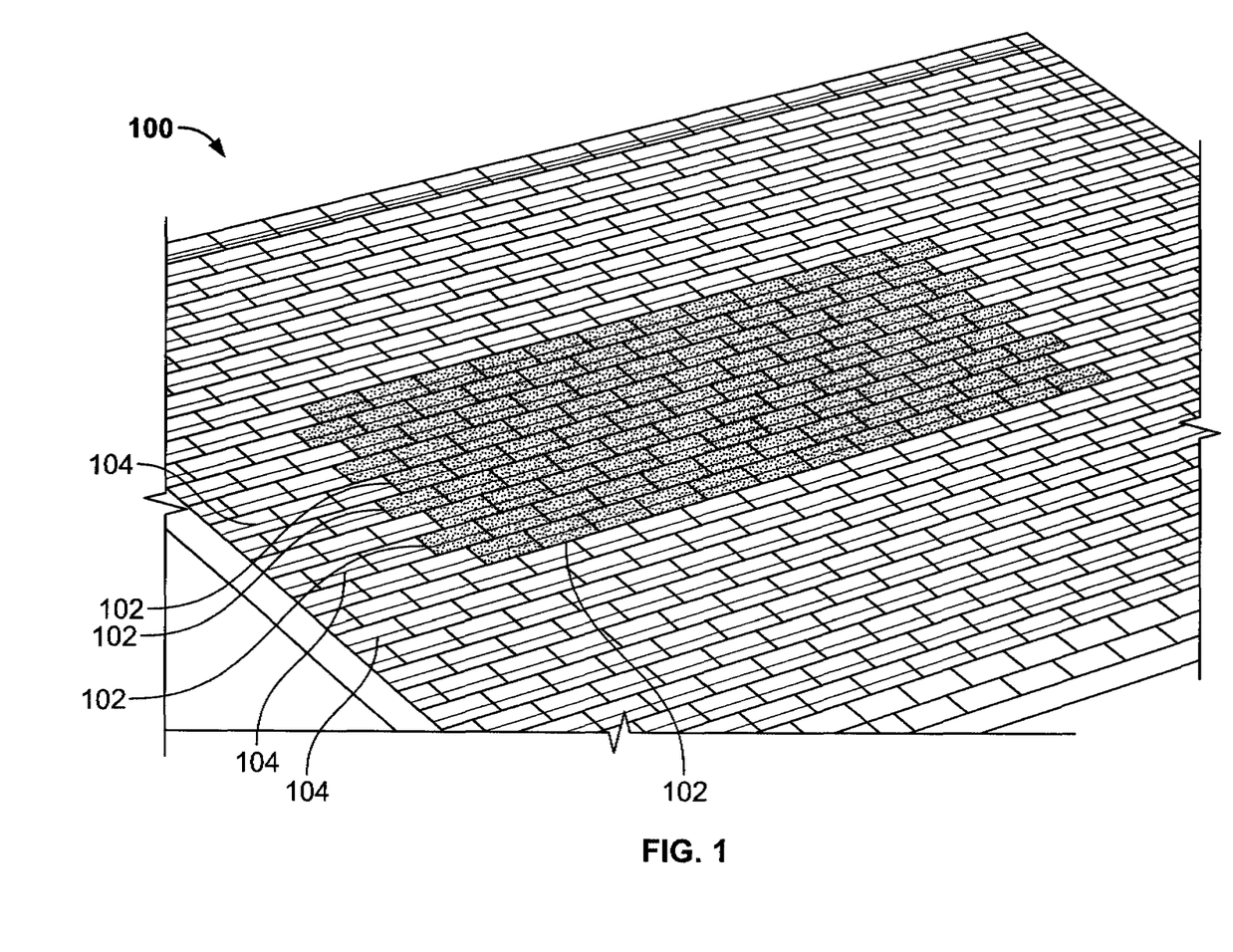
FIG. 1 is a perspective view of a roof including a plurality of exemplary photovoltaic roofing systems in accordance with an embodiment of the present invention.

FIG. 1 is a perspective view of a roof 100 including a plurality of exemplary photovoltaic roofing systems 102 in accordance with an embodiment of the present invention. A plurality of non-photovoltaic roofing shingles 104 are mixed in combination with the photovoltaic roofing systems 102 to form roof 100. In FIG. 1, photovoltaic roofing systems 102 are shown darker than non-photovoltaic roofing shingles 104 for illustration only. In the exemplary embodiment, photovoltaic roofing systems 102 are colored to match non-photovoltaic roofing shingles 104. Although non-photovoltaic roofing shingles are described herein as "shingles", they may be more complex assemblies than typical roofing shingles, for example, non-photovoltaic roofing shingles may include a plurality of components and may lay flat on roof 100, or may be textured or shaped to a particular feature. Photovoltaic roofing system 102 is configured to match a color, shape, and/or texture of non-photovoltaic roofing shingles 104 such that an aesthetic look is achieved. Additionally, a thickness of photovoltaic roofing systems 102 is selected to substantially match the thickness of non-photovoltaic roofing shingles 104 such that a profile difference between non-photovoltaic roofing shingles 104 and photovoltaic roofing systems 102 is essentially indiscernible.

Figure 2:
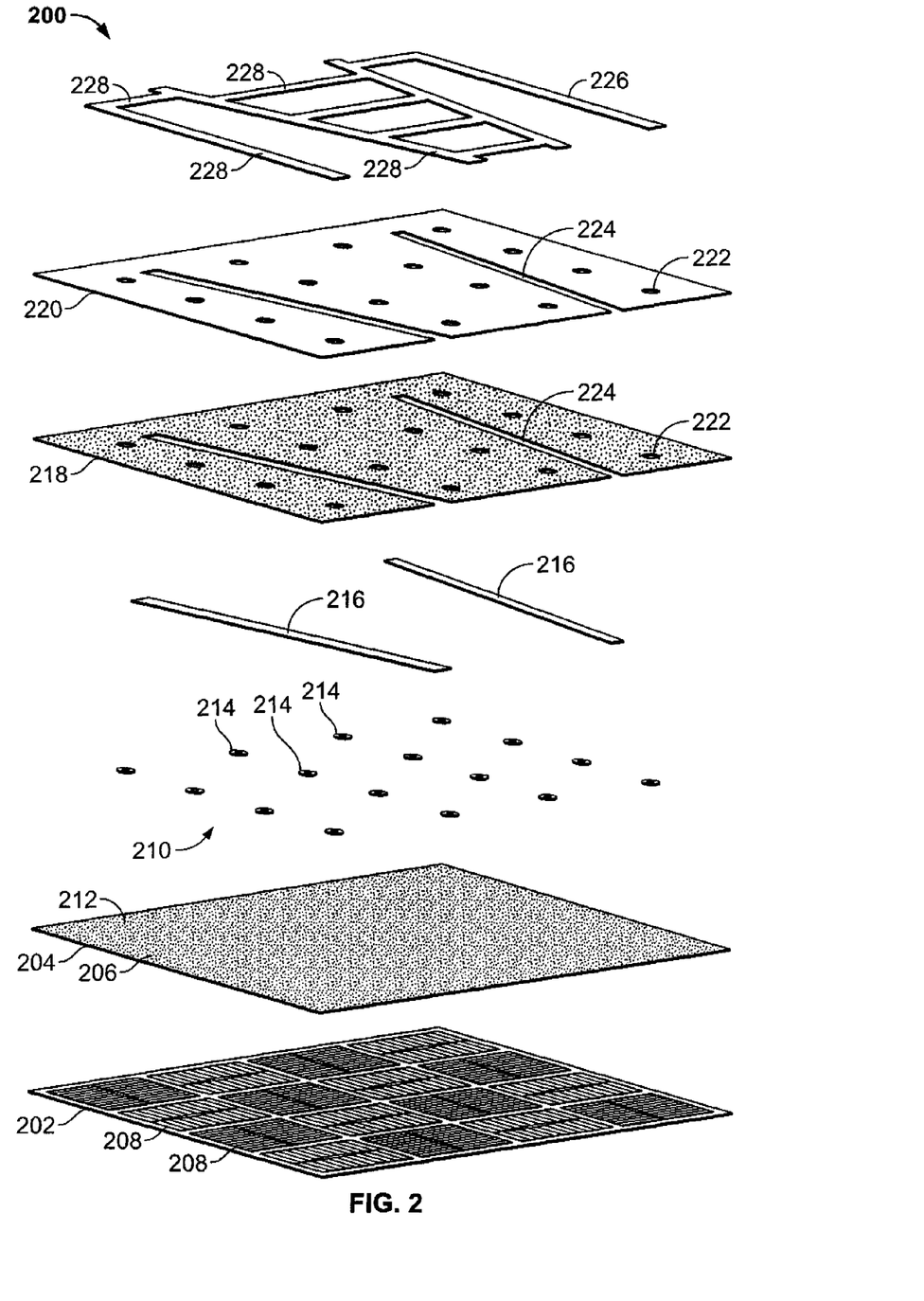
FIG. 2 is an exploded view of an exemplary photovoltaic cell that may be used with photovoltaic roofing systems shown in FIG. 1.

FIG. 2 is an exploded view of an exemplary photovoltaic cell 200 that may be used with photovoltaic roofing systems 102 (shown in FIG. 1). Photovoltaic cell 200 includes a waffle grid pattern 202 that is exposed to the sun when photovoltaic cell 200 is in operation. A molded wafer of photovoltaic material 204 is positioned on waffle grid pattern 202. A first side 206 adjacent waffle grid pattern 202 is exposed to the sun during operation through opening 208 formed in waffle grid pattern 202. A front contact wrap through layer 210 is applied to a second side 212 of photovoltaic material 204. Front contact wrap through layer 210 is configured to provide a plurality of connection points 214 on second side 212 for connection to electrical bussing that will transmit the output of photovoltaic material 204 external to photovoltaic cell 200. A back contact bussing 216 is coupled to a cathode portion of photovoltaic material 204. A back field layer 218 and a dielectric layer 220 are applied over photovoltaic material 204 with openings 222, 224 that are complementary to front contact wrap through layer 210 and back contact bussing 216, respectively such that front contact wrap through layer 210 and back contact bussing 216 are exposed through back field layer 218 and dielectric layer 220. In the exemplary embodiment, back field layer 218 is fabricated from a metal ink, for example, but not limited to, aluminum or copper. A front contact bussing 226 is applied over dielectric layer 220 such that legs 228 of front contact bussing 226 are arranged to cover openings 222 and make connection to photovoltaic material 204 through connection points 214. In the exemplary embodiment, connection points 214 are coupled to photovoltaic material 204 at cathode sites on photovoltaic material 204 such that front contact bussing is negatively charged during operation and back contact bussing 216 is coupled to photovoltaic material 204 at anode sites such that back contact bussing 216 is positively charged during operation. In an alternative embodiment, the polarity of back contact bussing 216 and front contact bussing 226 may be reversed during operation by coupling them to cathode sites and anode sites respectively. Both bus systems are coupled to a single side of photovoltaic material 204, and in the exemplary embodiment, it is the side opposite of the side that receives the sunlight to provide the motive force for electron flow in photovoltaic material 204.

Figure 3:
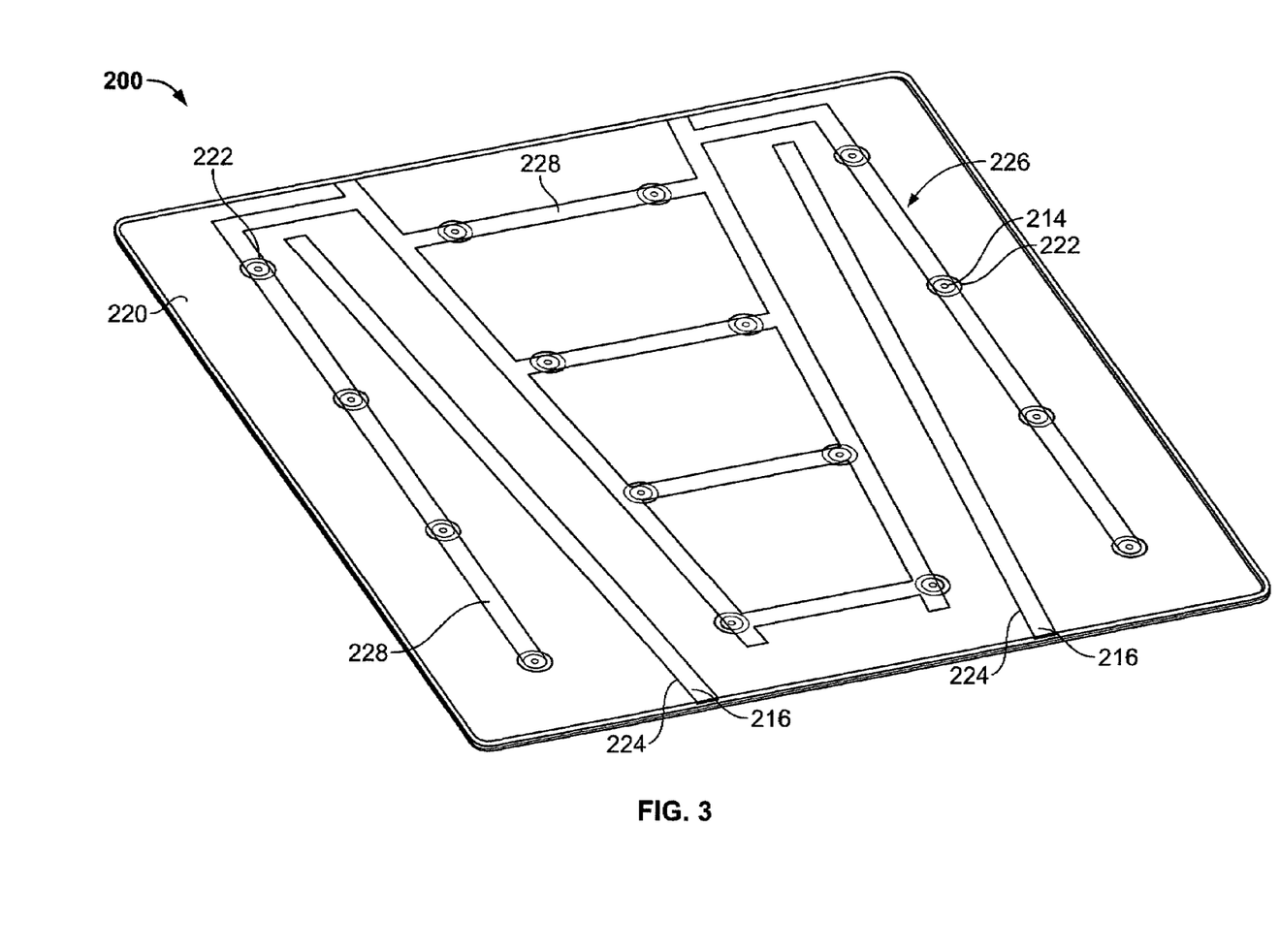
FIG. 3 is a perspective view of the photovoltaic cell shown in FIG. 2 after assembly.

FIG. 3 is a perspective view of photovoltaic cell 200 (shown in FIG. 2) after assembly. Front contact bussing 226 is electrically connected to photovoltaic material 204 through connection points 214 coupled to side 212 of photovoltaic material 204. Connection points 214 are exposed to front contact bussing 226 through openings 222 in dielectric layer 220 and back field layer 218. Back contact bussing 216 is electrically connected to photovoltaic material and is exposed through openings 224 in dielectric layer 220 and back field layer 218. In the exemplary embodiment, both front and back contact bussing 226, 216, respectively are electrically coupled to the same side of photovoltaic material 204.

Figure 4:
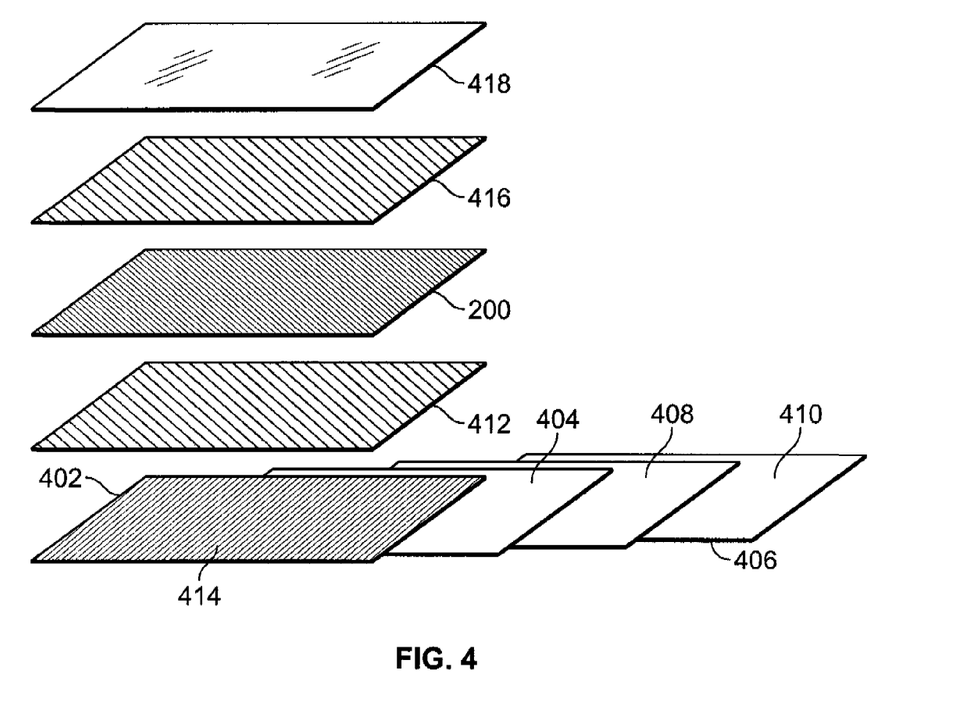
FIG. 4 is an exploded view of the exemplary photovoltaic roofing system shown in FIG. 1.

FIG. 4 is an exploded view of an exemplary photovoltaic roofing system 102 (shown in FIG. 1). Photovoltaic roofing system 102 includes a back sheet 402 comprising for example, a polyvinyl fluoride (PVF) film. An interconnection portion 404 permits a plurality of electrical wires to couple one or more photovoltaic cells to each other or to an electrical plug connection 406. An encapsulation portion 408 permits the electrical wires and plug connection 406 to be sealed from ambient. In the exemplary embodiment, a header portion 410 is configured to receive one or more fasteners for affixing photovoltaic roofing system 102 to a roof. In the exemplary embodiment, photovoltaic roofing system 102 includes a first ethylene-vinyl acetate (EVA) layer 412 applied to an active portion 414 of back sheet 402. One or more photovoltaic cells 200 are positioned on EVA layer 412 such that an edge of EVA layer 412 extends beyond an edge of photovoltaic cell 200 on all four sides. A second EVA layer 416 is applied to photovoltaic cell 200 such that the edges of second EVA layer 416 extend beyond the edges of photovoltaic cell 200 and substantially match the edges of first EVA layer 412. In the exemplary embodiment, the edges of first EVA layer 412 and second EVA layer 416 are sealed to form a hermetic environment within first EVA layer 412 and second EVA layer 416 and surrounding photovoltaic cell 200. Photovoltaic roofing system 102 includes a protective layer 418 such as solar glass. Production techniques used in the manufacture of photoelectric sensitive material 204 are selected such that the color of photovoltaic roofing system 102 as finally assembled is configured to match a non-photovoltaic roofing shingle or system that is positioned adjacent photovoltaic roofing system 102.

Figure 5:
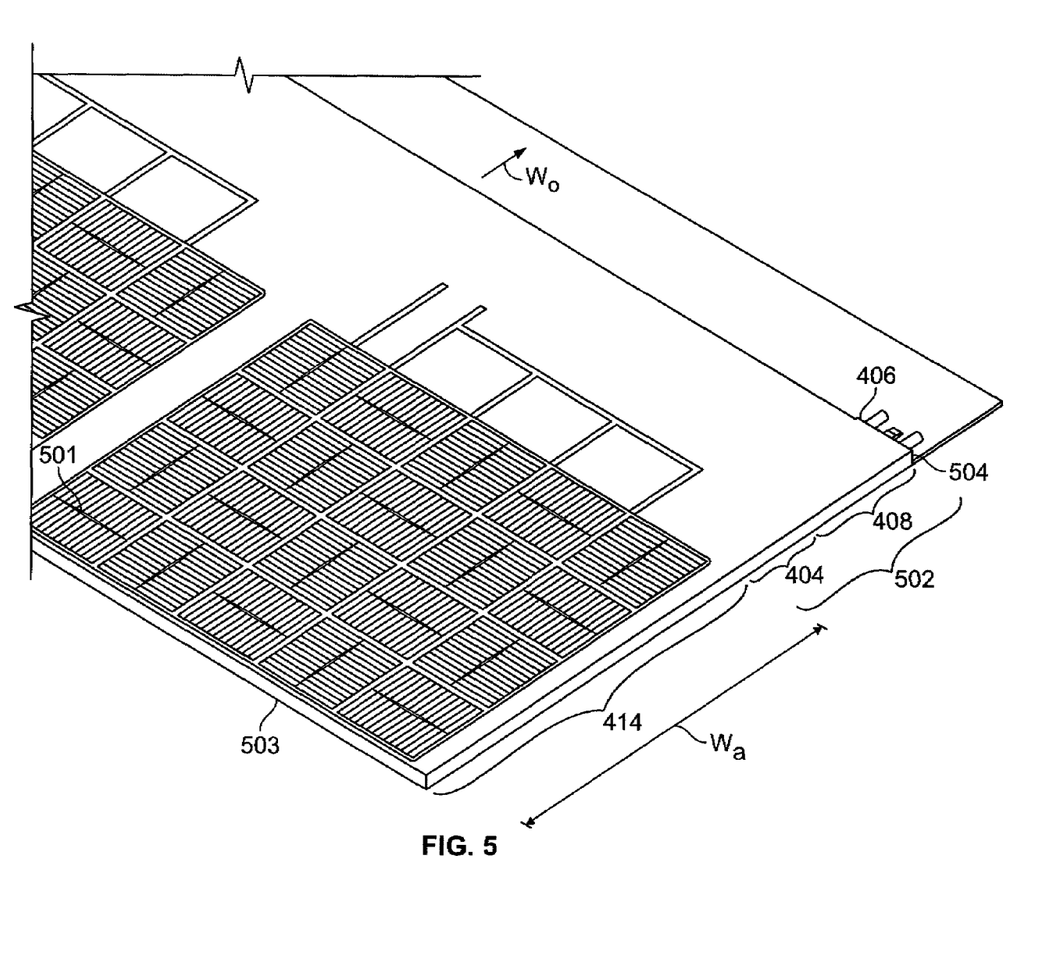
FIG. 5 is a perspective view of a photovoltaic roofing system in accordance with an embodiment of the present invention.

FIG. 5 is a perspective view of a photovoltaic roofing system 102 in accordance with an embodiment of the present invention. Photovoltaic roofing system 102 includes back sheet 402 having a length and a width $W_O$. In this embodiment, back sheet 402 includes one or more notches 501 defined by a slit or cutout through back sheet 402 and extending at least partially through a width $W_A$ of active portion 414 to divide active portion 414 into a plurality of tabs 503. In various other embodiments, back sheet 402 does not include notches 501. Photovoltaic roofing system 102 also includes active portion 414, and an overlay portion 502 on back sheet 402. Overlay portion includes interconnection portion 404, encapsulation portion 408, header portion 410, and plug connection 406. Plug connection 406 extends from an upper edge 504 or lower edge 505 with respect to the pitch of the rroof such that electrical connections are made to other assemblies 200 above or below each assembly 200. Waffle grid pattern 208 is exposed to the sun on an upper surface of back sheet 402. Interconnection portion 404 includes a plurality of electrical traces or wires that carry electrical current from photovoltaic material 204 to plug connection 406.

Figures 6A, 6B:
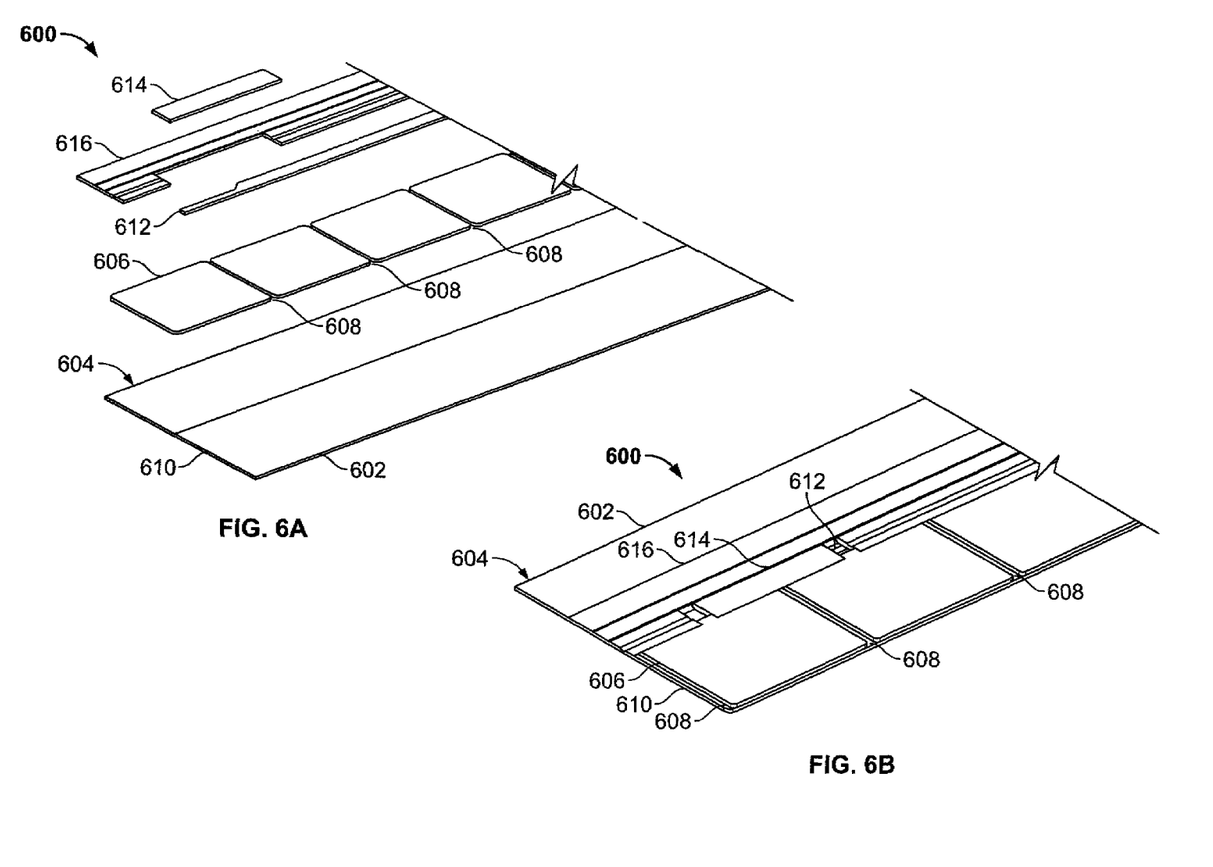
FIG. 6A is an exploded perspective view of the photovoltaic roofing system in accordance with another embodiment of the present invention.
FIG. 6B is a perspective view of the photovoltaic roofing system in accordance with another embodiment of the present invention.

FIGS. 6A and 6B are perspective views of photovoltaic roofing system 600 in accordance with another embodiment of the present invention. FIG. 6A is an exploded view with respect to FIG. 6B. Photovoltaic roofing system 102 includes a roofing membrane 602 configured to extend under the entire photovoltaic roofing system 600 assembly and also includes a header portion 604. In the exemplary embodiment, roofing membrane 602 does not include cutouts for separating shingle tabs. The tab "look" is achieved by spacing a plurality of electrically active shingle tab assemblies 606 with a gap 608 between assemblies 606 and along a roofing membrane edge 610. Electrically active shingle tab assembly 606 is coupled to roofing membrane 602 such as by using an adhesive to affix tab assembly 606 to roofing membrane 602. Interconnect wiring 612 connects electrically active shingle tabs 606 together in series with a plug assembly 614. Interconnect wiring 612 is sandwiched between a stiffener 616 and roofing membrane 602 using an adhesive encapsulant. Stiffener 616 extends above interconnect wiring 612 and is used with header portion 604 as a nailing header for fastening photovoltaic roofing system 600 to a roof. Two rows of nails may be used, similar to standard roofing shingle installations. Plug assembly 614 includes a small wire extending downward from the middle of plug assembly 614, which connects assembly 606 to the next row down on the roof. Once assembled on the roof, plug assembly 614 is completely covered by the shingle tab from the row above.

Figure 7:
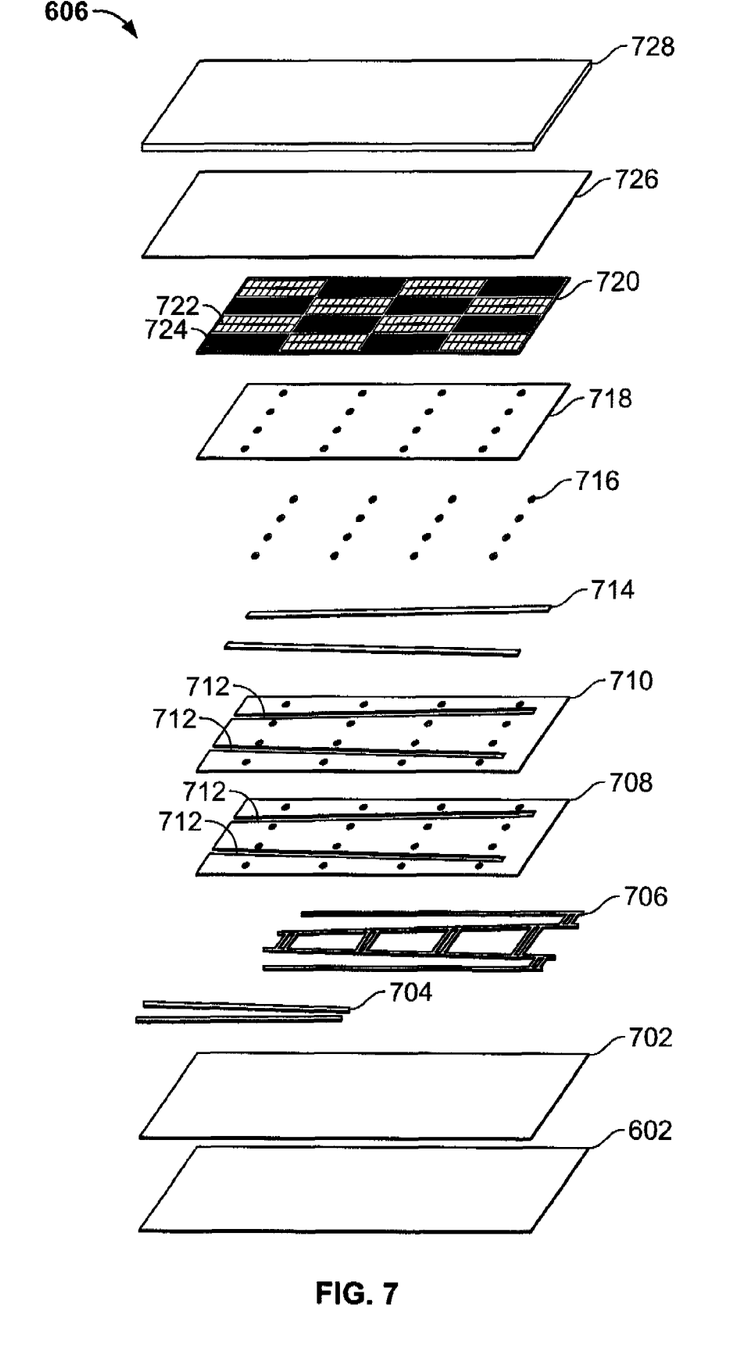
FIG. 7 is an exploded view of an exemplary embodiment of an electrically active shingle tab assembly shown in FIGS. 6A and 6B.

FIG. 7 is an exploded view of an exemplary embodiment of an electrically active shingle tab assembly 606 (shown in FIGS. 6A and 6B). In the exemplary embodiment, tab assembly 606 includes roofing membrane 602, a first encapsulant layer 702 fabricated from for example, ethylene-vinyl acetate (EVA). An interconnection portion 704 permits a plurality of electrical wires to couple one or more photovoltaic cells to each other or to an electrical plug connection (not shown). A front contact bussing structure 706 is electrically coupled to interconnection portion 704. A dielectric layer 708 is applied over front contact bussing structure 706 and a back field layer 710 is applied over dielectric layer 708. Openings 712 in dielectric layer 708 and back field layer 710 facilitate electrical connection through dielectric layer 708 and back field layer 710. Back contact bussing 714 and a front contact wrap through layer 716 is exposed to front contact bussing structure 706 through openings 712. A molded wafer of photovoltaic material 718 is positioned over front contact wrap through layer 716 and an optional waffle grid pattern 720 is applied over photovoltaic material 718. A first side 722 of waffle grid pattern 720 is exposed to the sun during operation through a plurality of openings 724 formed in waffle grid pattern 720. A second encapsulant layer 726 fabricated from for example, ethylene-vinyl acetate (EVA) is applied over waffle grid pattern 720, if used, and sealed to first encapsulant layer 702 to form a hermetic environment therebetween. A protective layer 728 such as solar glass is applied over second encapsulant layer 726.

Exemplary embodiments of photovoltaic roofing systems and are described above in detail. The photovoltaic roofing system components illustrated are not limited to the specific embodiments described herein, but rather, components of each photovoltaic roofing system may be utilized independently and separately from other components described herein. For example, the photovoltaic roofing system components described above may also be used in combination with different photovoltaic roofing system components.

The above-described photovoltaic roofing systems and methods are cost-effective and highly reliable. The method permits maintaining the aesthetic appeal of a shingle type roof using both photovoltaic and non-photovoltaic roofing systems in adjacent position with respect to each other. A thickness of each roofing system is configured to match giving an even profile when viewed by a user. The appearance and profile permits using the above described photovoltaic roofing system with a variety of non-photovoltaic roofing systems with a minimum of obvious aesthetic differences between the two systems. Accordingly, the systems and methods described herein facilitate the operation of photovoltaic roofing systems in a cost-effective and reliable manner.

While the invention has been described in terms of various specific embodiments, those skilled in the art will recognize that the invention can be practiced with modification within the spirit and scope of the claims.

What is claimed is:

1. A photovoltaic roofing system comprising:
   a back sheet comprising a length, L, a width, W, and a thickness, T, said back sheet comprising an overlap portion extending along length L having a width, $W_o$ and an active portion extending along length L having a width, $W_A$;
   a photovoltaic cell formed on a surface of said active portion, said photovoltaic cell comprising a photovoltaic member electrically responsive to an absorption of photons, a negative electrode coupled to a surface of said photovoltaic member, a positive electrode coupled to said surface of said photovoltaic member, a back field layer coupled to said surface of said photovoltaic member and comprising a first plurality of openings defined therein for use in coupling said photovoltaic member surface to said negative electrode and a second plurality of openings defined therein for use in coupling said photovoltaic member surface to said positive electrode, and a dielectric layer coupled to said back field layer and comprising a third plurality of openings defined therein and a fourth plurality of openings defined therein, said third plurality of openings substantially aligned with said first plurality of openings, said fourth plurality of openings substantially aligned with said second plurality of openings, wherein said thickness T is selected such that thickness T plus a thickness of the photoelectric cell substantially match a thickness of a proximate non-photovoltaic roofing member when said photovoltaic roofing system is installed; and
   a plug connection coupled to an upper surface of said back sheet, said plug connection for electrically coupling said photovoltaic cell to another photovoltaic cell.

2. A system in accordance with claim 1 further comprising a sub-sheet comprising a thickness, said sub-sheet positioned against a back surface of said back sheet such that thickness T plus a thickness of the photoelectric cell plus the thickness of the sub-sheet substantially matches a thickness of a proximate non-photovoltaic roofing member when said photovoltaic roofing system is installed.

3. A system in accordance with claim 1 wherein said overlap portion comprises a header portion configured to permit said roofing assembly to be coupled to a roof surface.

4. A system in accordance with claim 1 further comprising a plurality of photovoltaic cells formed in the active portion said photovoltaic cells spaced apart by a gap between adjacent edges of the photovoltaic cells.

5. A system in accordance with claim 1 wherein said plug connection is configured to electrically couple a plurality of photovoltaic roofing assemblies.

6. A system in accordance with claim 1 wherein said overlap portion comprises an electrical interconnection portion configured to bus electrical connections from the plurality of photovoltaic cells to said plug connection.

7. A system in accordance with claim 3 wherein said header portion is configured to permit nailing said roofing assembly to a roof surface using standard roofing nails.

8. A system in accordance with claim 1 wherein said positive electrode comprises a positive bus coupled to said surface of said photovoltaic member, and said negative electrode comprises a negative bus covering at least a portion of said dielectric layer, said third plurality of openings are complementary to said negative bus such that said negative bus is electrically couplable to said photovoltaic member through said third plurality of openings.

9. A method of assembling a photovoltaic roofing system comprising:
   providing a substrate of roofing material including a top surface, a bottom surface, the substrate includes an overlay portion configured to be covered by at least one of an adjacent photovoltaic roofing system and an adjacent roofing shingle, the substrate further includes an active portion;
   forming a photovoltaic cell on the top surface of the active portion, the photovoltaic cell including a photovoltaic member electrically responsive to an absorption of photons, a negative electrode coupled to a surface of the photovoltaic member, a positive electrode coupled to the surface of the photovoltaic member, a back field layer coupled to the photovoltaic member surface and including a first plurality of openings defined therein for use in coupling the photovoltaic member surface to the negative electrode and a second plurality of openings defined therein for use in coupling the photovoltaic member surface to the positive electrode, and a dielectric layer coupled to the back field layer and including a third plurality of openings defined therein and a fourth plurality of openings defined therein, the third plurality of openings aligned with the first plurality of openings, the fourth plurality of openings aligned with the second plurality of openings;
   coupling a plug connection to the top surface, wherein the plug connection is configured to electrically couple the photovoltaic cell to another photovoltaic cell; and electrically coupling the negative electrode and the positive electrode to the plug connection, wherein the plug connection extends from the photovoltaic cell.

10. A method in accordance with claim 9 wherein said substrate comprises polyvinyl fluoride (PVF).

11. A method in accordance with claim 9 wherein electrically coupling the negative electrode and the positive electrode to the plug connection comprises electrically coupling the negative electrode and the positive electrode to an electrical plug extending from the photovoltaic cell adjacent the overlay portion.

12. A method in accordance with claim 9 wherein the photovoltaic roofing system comprises a plurality of photoelectric cells, each cell including a negative electrode and the positive electrode and wherein electrically coupling the negative electrode and the positive electrode to the plug connection comprises electrically coupling a plurality of negative electrodes and a plurality of positive electrodes in at least one of a series connection, a parallel connection, and a combination thereof.

13. A method in accordance with claim 9 further comprising covering the photovoltaic cell with at least one of a transparent layer and a translucent layer exposed to ambient.

14. A method in accordance with claim 13 further comprising substantially matching a coloring of the photovoltaic roofing system with a proximate non- photovoltaic roofing member when the photovoltaic roofing system is installed.

15. A method in accordance with claim 9 further comprising electrically coupling a plurality photovoltaic roofing systems together using the electrical plug.

16. A photovoltaic roofing system comprising:
a back sheet comprising a first thickness, said back sheet comprising an overlap portion, a header portion configured to permit said roofing assembly to be coupled to a roof surface, and an adjacent active portion extending from said overlap portion;
a photovoltaic cell formed on a surface of said active portion, said photovoltaic cell comprising a second thickness, said photovoltaic cell further comprising a photovoltaic member, a negative electrode coupled to a surface of said photovoltaic member, a positive electrode coupled to said surface of said photovoltaic member, a back field layer coupled to said photovoltaic member surface and comprising a first plurality of openings defined therein for use in coupling said photovoltaic member surface to said negative electrode and a second plurality of openings defined therein for use in coupling said photovoltaic member surface to said positive electrode, and a dielectric layer coupled to said back field layer and comprising a third plurality of openings defined therein and a fourth plurality of openings defined therein, said third plurality of openings aligned with said first plurality of openings, said fourth plurality of openings aligned with said second plurality of openings, wherein said first thickness plus said second thickness is substantially equal to a thickness of a proximate non-photovoltaic roofing member when said photovoltaic roofing system is installed; and
a plug connection configured to electrically couple said photovoltaic cell to another photovoltaic cell.

17. A system in accordance with claim 16 wherein said overlap portion comprises an electrical interconnect plug configured to electrically couple a plurality of photovoltaic roofing assemblies.

18. A system in accordance with claim 16 wherein said overlap portion comprises an electrical interconnection portion configured to bus electrical connections from the plurality of photovoltaic cells to an electrical interconnect plug.

19. A system in accordance with claim 16 wherein said header portion is configured to permit nailing said roofing assembly to a roof surface using standard roofing nails.

20. A system in accordance with claim 16 wherein said positive electrode comprises a positive bus coupled to said surface of said photovoltaic member, and said negative electrode comprises a negative bus covering at least a portion of said dielectric layer, said third plurality of openings are complementary to said negative bus such that said negative bus is electrically couplable to said photovoltaic member through said third plurality of openings.

* * * * *